United States Patent
Zhang et al.

(10) Patent No.: US 7,564,270 B1
(45) Date of Patent: Jul. 21, 2009

(54) DIFFERENTIAL OUTPUT DRIVER

(75) Inventors: Xiaohu Zhang, Starkville, MS (US);
George Ansel, Starkville, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/769,088

(22) Filed: Jun. 27, 2007

Related U.S. Application Data (60) Provisional application No. 60/940,761, filed on May 30, 2007.

(51) Int. Cl.
*H03K 19/086* (2006.01)

(52) U.S. Cl. .................. 326/127; 326/115; 326/121; 327/108

(58) Field of Classification Search ................. 326/127, 326/115, 112, 121; 327/108, 109
See application file for complete search history.

(56) References Cited

U.S. PATENT DOCUMENTS

| | | | |
|---|---|---|---|
| 6,429,700 B1 * | 8/2002 | Yang ........................... | 327/108 |
| 6,437,599 B1 * | 8/2002 | Groen ......................... | 326/63 |
| 6,529,043 B1 | 3/2003 | Hannan | |
| 6,590,422 B1 | 7/2003 | Dillon | |
| 6,590,435 B1 | 7/2003 | Hannan et al. | |
| 6,600,346 B1 | 7/2003 | Macaluso | |
| 6,639,434 B1 * | 10/2003 | Rahman ...................... | 327/108 |
| 6,661,288 B2 * | 12/2003 | Morgan et al. .............. | 330/258 |
| 6,720,805 B1 * | 4/2004 | Haas ........................... | 327/108 |
| 6,731,135 B2 * | 5/2004 | Brunolli ...................... | 326/83 |
| 6,788,116 B1 | 9/2004 | Cook et al. | |
| 6,943,588 B1 * | 9/2005 | Luo et al. ..................... | 326/86 |
| 7,012,450 B1 * | 3/2006 | Oner et al. ................... | 326/86 |
| 7,068,077 B1 | 6/2006 | Reinschmidt | |
| 7,088,166 B1 | 8/2006 | Reinschmidt et al. | |
| 2003/0085737 A1 | 5/2003 | Tinsley et al. | |
| 2005/0088223 A1 * | 4/2005 | Morgan et al. .............. | 327/541 |

* cited by examiner

*Primary Examiner*—Vibol Tan (57) ABSTRACT

A driver circuit is provided herein. In general, the driver circuit includes a driver portion, a common mode feedback portion and a current replication portion. The feedback portion receives a common mode voltage (vcm) from the driver portion and an alternative common mode voltage (vcm_alt) from the current replication portion. The feedback portion selects one of the common mode voltages for comparison with a reference voltage and generates a feedback bias signal (vcmfb) based on a voltage difference there between. When the driver circuit is enabled, the actual common mode voltage (vcm) is used to maintain the output common mode voltage around the reference voltage. When the driver circuit is disabled, the alternative common mode voltage (vcm_alt) is used to keep the bias signal (vcmfb) from drifting away.

21 Claims, 5 Drawing Sheets

DIFFERENTIAL OUTPUT DRIVER

PRIORITY CLAIM

The present application claims priority to U.S. Provisional Application No. 60/940,761 entitled "Differential Output Driver with Improved Output Enable Timing," filed May 30, 2007.

BACKGROUND OF THE INVENTION

1. Technical Field

This disclosure relates to driver circuits.

2. Description of the Related Art

The following descriptions and examples are given as background only.

The transmission of data involves sending and receiving data over a transmission path, which is connected between a pair of transceivers. Each transceiver may include a receiver and a transmitter (or output driver). The receiver functions to receive data from the transmission path, while the transmitter functions to drive data onto the transmission path. The transfer of data between receiver and transmitter circuits fabricated on separate chips is sometimes referred to as "off-chip" signaling or "chip-to-chip" communication.

Single-ended signals are typically used for on-chip communication because of the reduced area consumption and design complexity generally involved in routing these signals. However, more and more off-chip signals, or signals used for chip-to-chip communication, are routed as differential signals because of their decreased sensitivity to environmental noise. For this reason, numerous interface standards such as Low Voltage Differential Signaling (LVDS), Stub Series Terminated Logic (SSTL), differential High-Speed Transceiver Logic (HSTL) and Low Voltage Positive Referenced Emitter Coupled Logic (LVPECL) have been established for sending and receiving differential signals across a transmission path. The differential signals used by these standards typically have smaller amplitudes (i.e., reduced swings) to facilitate high speed chip-to-chip communications.

LVDS, in particular, is a low swing, differential signaling technology with relatively high data transmission rates (ranging, e.g., from 100's of Mbps to more than 2 Gbps). In addition to high-speed, LVDS driver circuits provide low noise and low power consumption across a wide range of operating frequencies. These advantages have made LVDS a very popular data transmission standard. For example, LVDS is currently used in a broad range of applications, including various computing applications (e.g., flat panel displays, SCI processor interconnects and multimedia links), telecommunication and data communication applications (e.g., switches, hubs, routers, access systems and base stations) and consumer applications (e.g., home video links and set top boxes).

Figure 1:
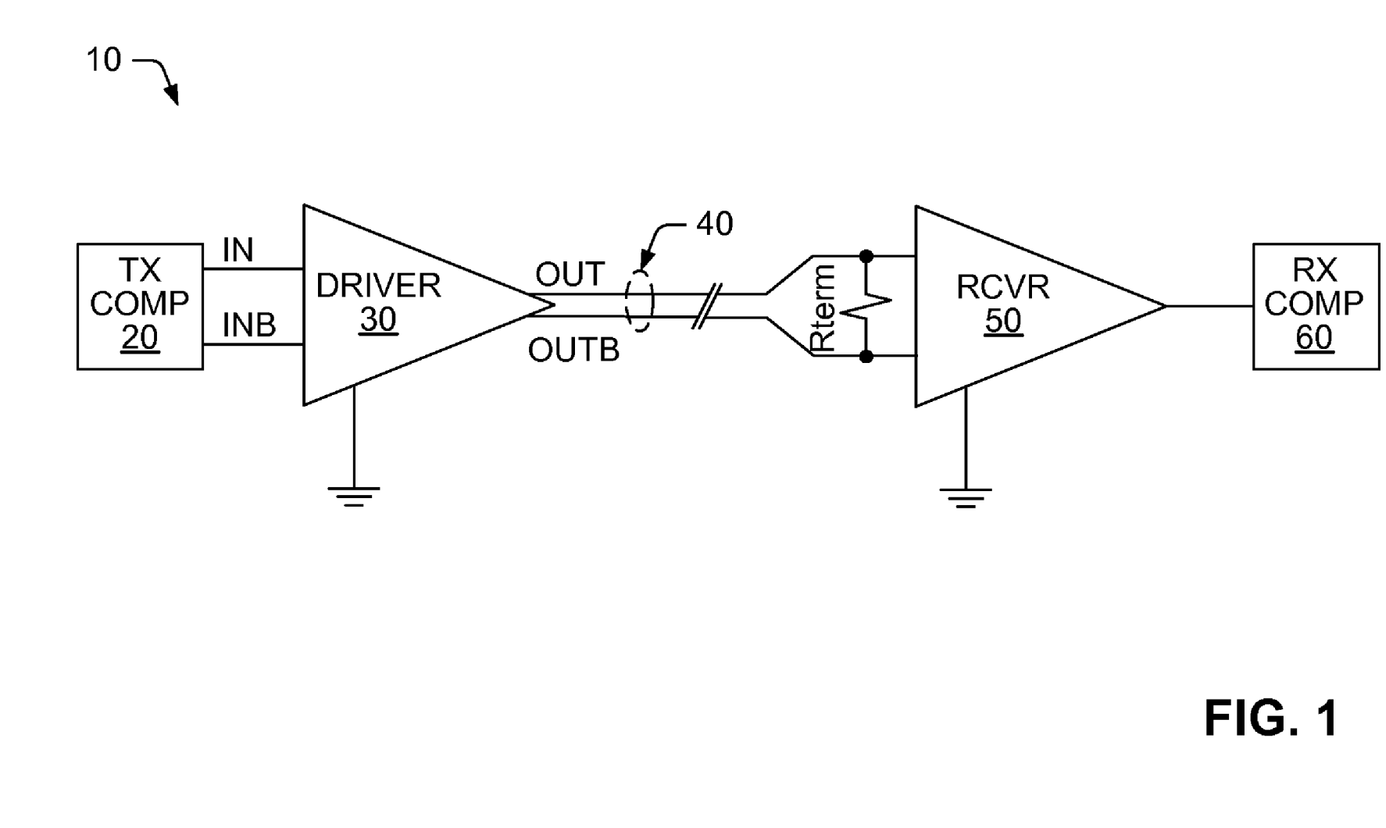
FIG. 1 is a block diagram illustrating a transmission system comprising a driver circuit and receiver coupled via a differential signal transmission line.
Figure 5:
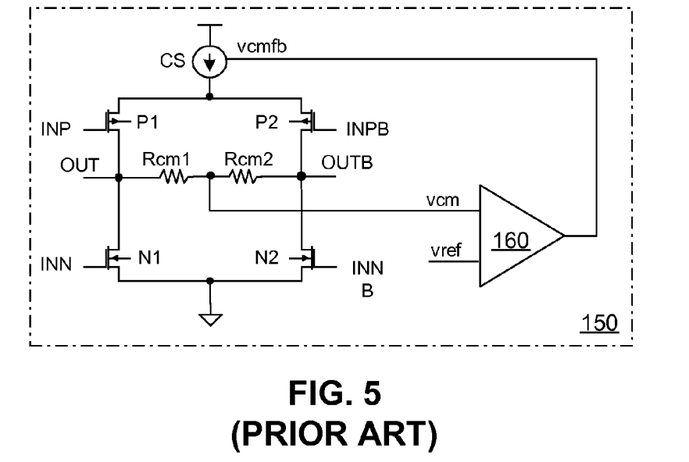
FIG. 5 is a circuit diagram illustrating a conventional driver circuit.

A typical LVDS driver is shown in FIG. 5. In the illustrated embodiment, the LVDS driver (150) is implemented with two pairs of complementary transistors (P1/N1 and P2/N2) coupled between a power supply and ground. A current source (CS) is coupled for driving the differential lines with a nominal drive current (e.g., 3.5 mA). As shown in FIGS. 1 and 5, the differential output signals (OUT, OUTB) generated between the complementary transistors may be driven across a transmission path 40 to a receiver 50. Most receivers are designed with high DC input impedance, so that a majority of the drive current flows across a small termination resistor (e.g., a 100Ω resistor) connected between the receiver inputs. When the driver circuit switches, the direction of current flow across the resistor changes to generate a logic high or logic low signal at the input of the receiver.

In some cases, a feedback amplifier 160 may be included to regulate the common mode voltage (vcm) of the differential output signals generated by the driver circuit. If included, the feedback amplifier may compare the common mode voltage to a reference voltage (vref) of about 1.25 volts. The voltage difference between the common mode and reference voltages may then be supplied back to the current source (CS) for adjusting the drive current. In this manner, the feedback control mechanism may be used to maintain the common mode voltage within an acceptable range.

Although LVDS circuits provide many advantages, conventional driver circuits tend to be very sensitive to circuit load conditions. For example, off-chip loads may drive the output pins of driver circuit 150 when the driver is disabled (i.e., when transistors P1, N1, P2 and N2 are inactive), causing the common mode voltage level to drift somewhere between the power supply and ground. The voltage drift is unknown and could be significant. When the driver circuit is subsequently re-enabled, the feedback amplifier may need a lot of time to stabilize the common mode voltage level and restore its output level. The time needed for the feedback amplifier to perform these functions is generally referred to as the "output enable time." Lengthy output enable times cause problems within systems employing the driver circuit by delaying the driver output signal. A need, therefore, exists for an improved LVDS driver circuit and method for improving the output enable timing of an LVDS driver circuit.

SUMMARY OF THE INVENTION

The following description of various embodiments of driver circuits, transmission systems and methods is not to be construed in any way as limiting the subject matter of the appended claims.

According to one embodiment, a driver circuit is provided herein with improved output enable timing. The driver circuit generally includes a driver portion, a replication portion and a feedback portion. The driver portion generates a drive current and a first common mode voltage. The replication portion replicates the drive current and generates a second common mode voltage. The feedback portion is coupled for receiving the first common mode voltage from the driver portion and the second common mode voltage from the replication portion. The feedback portion generally includes a selection circuit and a comparator. The selection circuit is coupled for selecting the first common mode voltage when the driver portion is enabled, and the second common mode voltage when the driver portion is disabled. The comparator is coupled for comparing the selected common mode voltage to a reference voltage and for supplying a feedback signal to the driver portion based on a difference detected there between. Output enable timing is improved by using the second common mode voltage to control the feedback signal when the driver circuit is disabled.

In one embodiment, the driver portion includes a transistor switchbox coupled in series between a first current source and a first current sink. As used herein, a "transistor switchbox" includes a first pair of series-connected transistors coupled in parallel with a second pair of series-connected transistors. Each pair of series-connected transistors includes one pull-up transistor (coupled to the current source) and one pull-down transistor (coupled to the current sink). The transistor switchbox generates differential output signals at the output nodes of the driver circuit by activating opposite transistors within the first and second pairs. The first common mode voltage is generated between a first pair of resistive elements coupled in series between the output nodes. The driver portion is: (i) enabled when input signals are supplied to the transistor switchbox to turn on opposite transistors within the first and second pairs for directing the drive current through an off-chip resistive element coupled between the output nodes, and (ii) disabled when input signals are supplied to turn off all four transistors in the transistor switchbox.

In one embodiment, the replication portion includes a second pair of resistive elements coupled in series between a second current source and a second current sink. As noted above, the replication portion is configured for replicating the drive current generated within the driver portion. In order to do so, the second current source and second current sink may be substantially identical to (or scaled versions of) the first current source and first current sink included within the driver portion. In addition, the second pair of resistive elements may be chosen, such that a combined resistance of the second pair of resistive elements is substantially identical to (or scaled versions of) a resistance of the off-chip resistive element. The second common mode voltage is generated between the second pair of resistive elements and supplied to the feedback portion, along with the first common mode voltage.

In one embodiment, the feedback portion may use a 2:1 multiplexer for selectively applying one of the common mode voltages to the comparator. In one example, the comparator may include a first transistor coupled for receiving the common mode voltage selected by the multiplexer, a second transistor coupled for receiving the reference voltage, a bias transistor coupled between ground and mutually-connected terminals of the first and second transistors, and a current mirror coupled for generating the feedback signal by comparing a current generated through the first transistor to a current generated through the second transistor. The two inputs of the multiplexer may be coupled for receiving the first and second common mode voltages. The output of the multiplexer may be coupled for supplying the selected common mode voltage to the first transistor based on a control signal supplied to the multiplexer.

In another embodiment, the feedback circuit may use an analog switch for selectively applying one of the common mode voltages to the comparator. In one example, the comparator may include a first transistor coupled for receiving the first common mode voltage, a second transistor coupled for receiving the reference voltage, a third transistor coupled for receiving the second common mode voltage, a bias transistor coupled between ground and mutually-connected terminals of the first, second and third transistors, and a current mirror coupled for generating the feedback signal by comparing a current generated through the second transistor to a current generated through only one of the first and third transistors. The switch may be generally coupled for connecting the current mirror to either the first transistor or the third transistor, depending on a control signal supplied to the switch. In one example, the switch may include a fourth transistor coupled in series between the first transistor and a diode-connected transistor of the current mirror, and a fifth transistor coupled in series between the third transistor and the diode-connected transistor.

A transmission system comprising the driver circuit is also contemplated herein. In one embodiment, the transmission system may include at least one system component configured for generating a pair of differential signals, and a transmitter (or driver circuit) configured to modulate the differential signals before the modulated signals are driven across a transmission path to a receiver. The transmitter may be generally configured as described above.

For example, the transmitter may include a driver portion, a replication portion, a selection portion, a feedback portion and a pair of output nodes. The driver portion may be coupled for modulating the differential signals and for generating a first common mode voltage of the modulated signals. In some cases, the driver portion may be configured for modulating the differential signals in accordance with an interface standard selected from a group comprising Low Voltage Differential Signaling (LVDS), Stub Series Terminated Logic (SSTL), differential High-Speed Transceiver Logic (HSTL) and Low Voltage Positive Referenced Emitter Coupled Logic (LFPECL). The driver portion is directly connected to the output nodes of the driver circuit. This enables the driver portion to supply the modulated signals to the transmission path when the driver portion is enabled.

The replication portion is coupled for generating a second common mode voltage. Unlike the driver portion, the replication portion is disconnected from the output nodes of the driver circuit. This enables the replication portion to generate a second common mode voltage, which is unaffected by circuit loads coupled to a receiving end of the transmission path when the driver portion is disabled. The replication portion, therefore, generates a common mode voltage that is not susceptible to voltage drift. The selection portion is coupled for selecting the first common mode voltage or second common mode voltage. More specifically, the selection portion is configured for selecting the first common mode voltage when the driver portion is enabled and the second common mode voltage when the driver portion is disabled. The feedback portion is coupled for comparing the selected common mode voltage to a reference voltage and for supplying a feedback signal to the driver portion based on a difference detected there between. The use of the second common mode voltage improves output enable timing by enabling a predictable feedback signal to be fed back to the driver portion when the driver portion is disabled.

According to another embodiment, a method is provided herein for operating a driver circuit. In some cases, the method may begin by generating a first common mode voltage and a second common mode voltage. Unlike other methods, which modify a common mode voltage to account for variations in PVT or circuit loads, the present method generates two common mode voltages (i.e., the first and second common mode voltages) at substantially the same time. This enables the method to selectively use the first common mode voltage or the second common mode voltage, depending on an operating state of the driver circuit. For example, the method may select the first common mode voltage when the driver circuit is enabled and the second common mode voltage when the driver circuit is disabled. After comparing the selected common mode voltage to a reference voltage, the method may supply a feedback signal to the driver circuit based on a difference detected there between. The method improves output enable timing by supplying a predictable feedback signal to the driver circuit when the driver circuit is disabled.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

FIG. 1 illustrates one embodiment of a transmission system 10. System 10 includes a transmission path 40 configured to receive differential signals (OUT, OUTB). The opposing ends of transmission path 40 may include a pair of interface devices, or transceivers. Though each interface device preferably includes both a receiver and transmitter, transmission system 10 is illustrated as including a receiver 50 on one end, and a transmitter (or driver circuit) 30 on the other end of transmission path 40. Transmitter 30 drives the differential signals across path 40 to receiver 50, which senses the voltage differential between the received signals.

Transmission system 10 may represent any communication system that operates in a low voltage environment and conveys data using differential signaling. In one embodiment, the differential signals are low voltage differential signals (LVDS) specified by the American National Standards Institute (ANSI)/Telecommunications Industry Association (TIA)/Electronic Industries Alliance (EIA) 644 standard, or the IEEE Std. 1596.3 standard. In this embodiment, receiver 50 is configured to accept differential input signals over a range of about 0-2.4 volts. However, transmission system 10 is not limited to transmitting LVDS, and may transmit data according to substantially any differential signal protocol currently known in the art or developed in the future.

Figure 2:
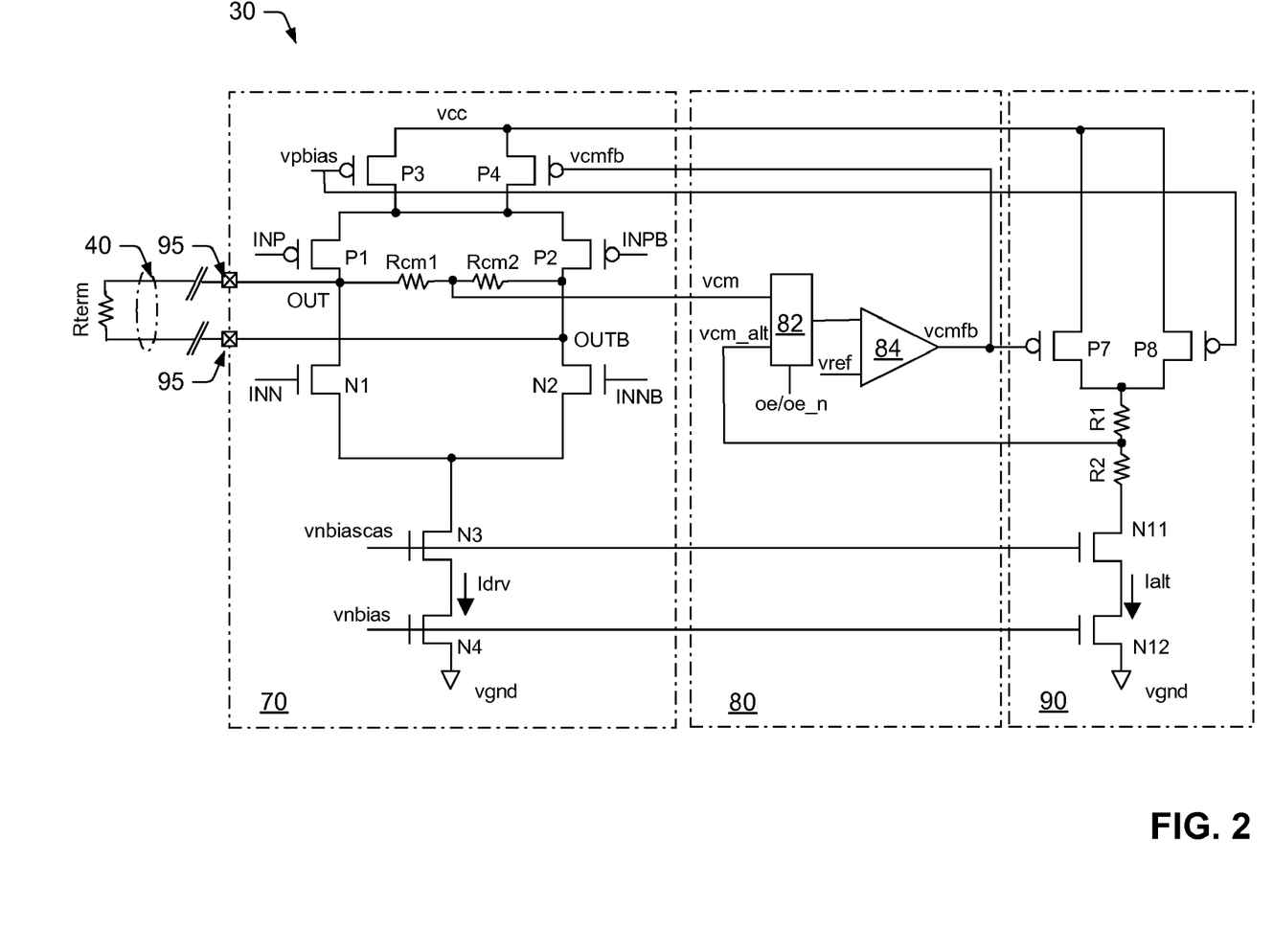
FIG. 2 is a circuit diagram illustrating one embodiment of the driver circuit generically shown in FIG. 1.

FIG. 2 illustrates one embodiment of a driver circuit 30 that may be included within transmission system 10. As shown in FIG. 2, driver circuit 30 includes a driver portion 70, a common mode feedback control portion 80, or simply "feedback portion," and a current replication portion 90. As described in more detail below, driver portion 70 is configured for modulating on-chip signals in accordance with a differential signal protocol (e.g., the LVDS interface standard) to produce high-speed, low-swing differential signals (OUT, OUTB) suitable for off-chip communication. Driver portion 70 is also configured for generating a common mode voltage (vcm) of the differential signals generated by the driver circuit. In some cases, the feedback portion 80 may compare the common mode voltage (vcm) to a reference voltage (vref) and supply a feedback signal (vcmfb) to the driver portion based on a voltage difference detected there between. The feedback signal may be used to adjust the drive current (Idrv), so that the common mode voltage (vcm) remains within an acceptable range.

Most conventional driver circuits suffer from lengthy output enable times when the driver circuit is first enabled. For example, conventional driver circuits are susceptible to off-chip loads, which may drive the output pins of the driver circuit when the driver is disabled. In some cases, the off-chip loads may cause the common mode voltage (vcm) to drift to an unknown voltage level. In many cases, a significant amount of "output enable time" (e.g., greater than 200 ns) is needed to stabilize the common mode voltage level and restore the feedback signal level after the driver circuit is subsequently re-enabled. As such, conventional driver circuits are often unable to meet the output enable timing requirements (e.g., about 120 ns) specified for LVDS driver circuits.

The present driver circuit improves output enable timing by adding a current replication portion 90 to the driver circuit. As described in more detail below, replication portion 90 generates an alternative common mode voltage (vcm_alt), which is used for generating the feedback signal when driver portion 70 is disabled. Unlike driver portion 70, replication portion 90 is disconnected from the output pins 95 of the driver circuit, and therefore, not susceptible to off-chip loads. This enables replication portion 90 to provide a predictable common mode voltage to the feedback portion 80 when the driver portion 70 is disabled. A selection circuit 82 is also added to the feedback portion 80 to select between the vcm and vcm_alt voltages. In most cases, the selection circuit 82 chooses the common mode voltage (vcm) when the driver portion is enabled. However, the alternative common mode voltage (vcm_alt) may be selected when the driver portion is disabled to avoid the timing delays caused by vcm drift. Selection of the alternative common mode voltage improves output enable timing by enabling the feedback portion to provide a stable feedback signal to the driver portion at all times.

Figure 3A:
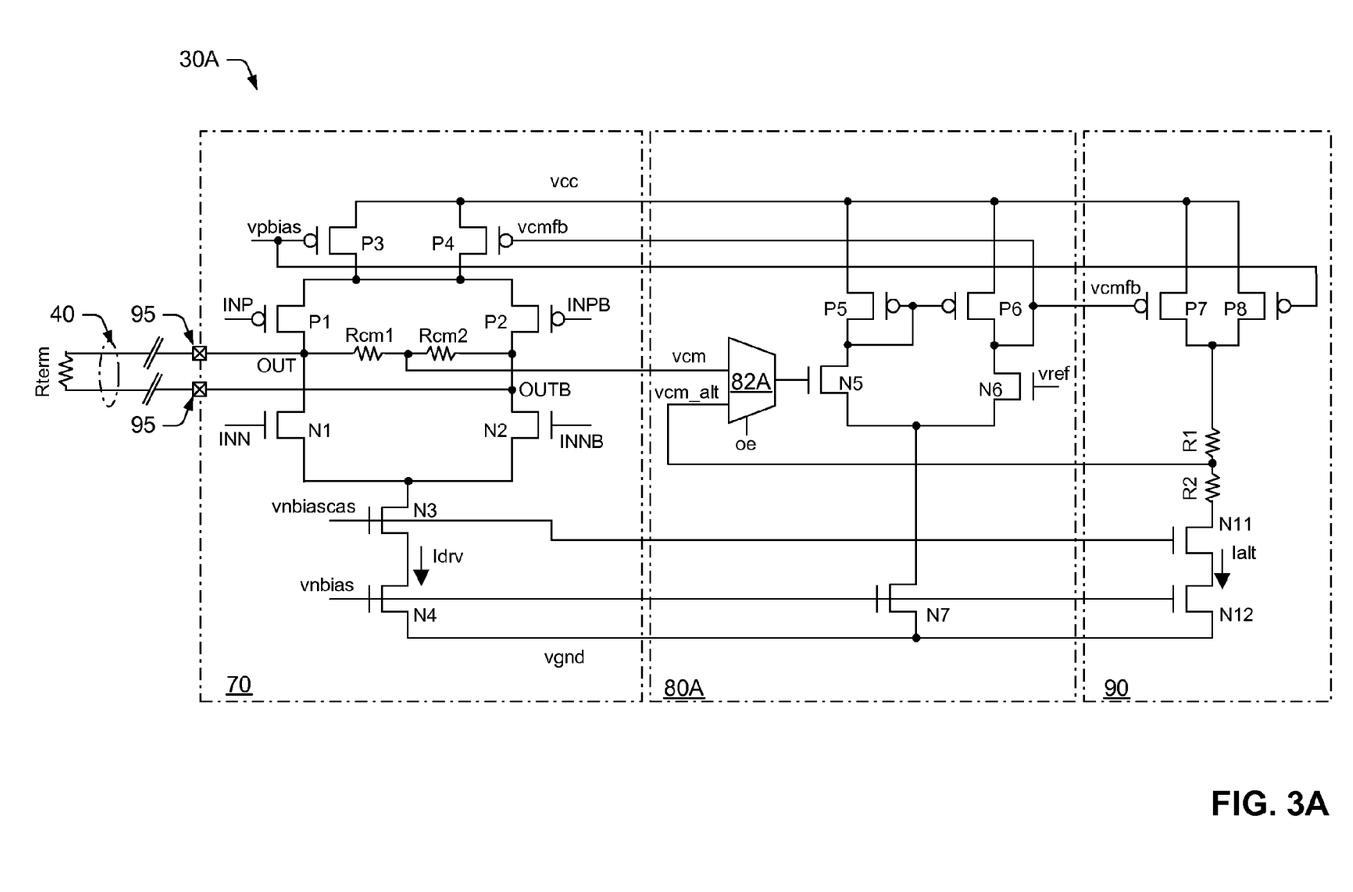
FIG. 3A is a circuit diagram illustrating another embodiment of the driver circuit generically shown in FIG. 1.
Figure 3B:
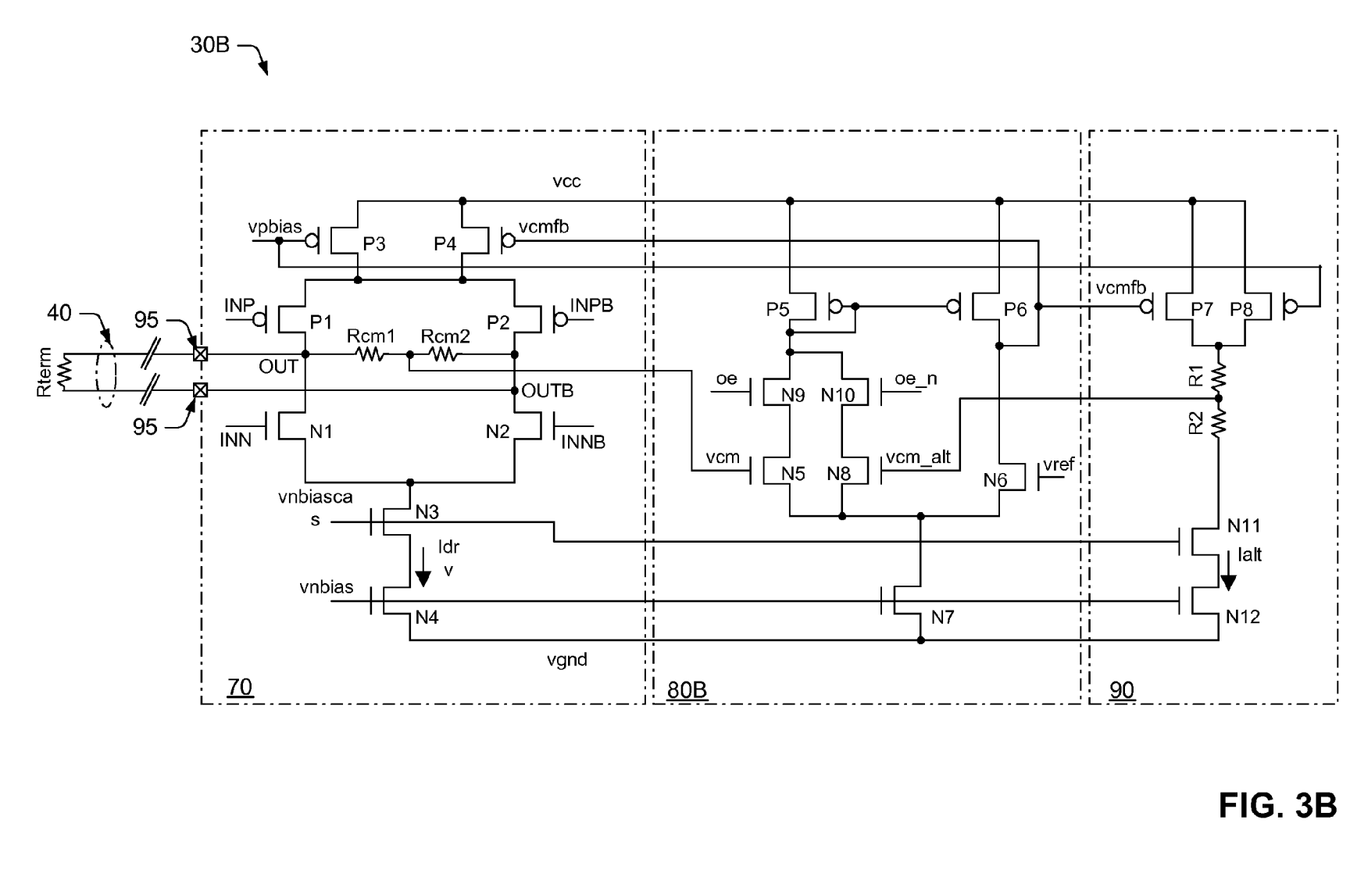
FIG. 3B is a circuit diagram illustrating yet another embodiment of the driver circuit shown in FIG. 1.

A general embodiment of the improved LVDS driver circuit is shown in FIG. 2. Various implementations of the feedback portion 80 are described in reference to FIGS. 3A and 3B. Although specific implementations are shown in FIGS. 2 and 3, a skilled artisan would understand how the inventive concepts described herein could be applied to other driver configurations without departing from the scope of the invention. The disclosure set forth herein is considered to include all such implementations.

The driver portion 70 shown in FIG. 2 includes a transistor switchbox coupled in series between a current source and a current sink. As used herein, a "transistor switchbox" may be described as including a first pair of series-connected transistors coupled in parallel with a second pair of series-connected transistors. Each pair of series-connected transistors includes one pull-up transistor (coupled to the current source) and one pull-down transistor (coupled to the current sink). The transistor switchbox generates differential output signals (OUT, OUTB) at the output nodes 95 of the driver circuit by activating opposite transistors within the first and second pairs. For example, a pull-up transistor may be activated within the first pair of series-connected transistors to pull the OUT node up to a logic high value, while a pull-down transistor is activated within the second pair of series-connected transistors to pull the OUTB node down to a logic low value. The differential output signals (OUT, OUTB) may be conveyed to an off-chip receiver (e.g., receiver 50, FIG. 1) by driving the output current (Idrv) generated by driver portion 70 across an off-chip termination resistor (Rterm) coupled between the receiver inputs. Opposite logic levels are conveyed by driving the output current in opposite directions.

In one embodiment, the transistor switchbox may be implemented with Complementary Metal Oxide Semiconductor (CMOS) transistors. In the embodiment of FIG. 2, for example, the first pair of series-connected transistors includes a p-type MOS (PMOS) transistor P1 coupled in series with an n-type MOS (NMOS) transistor N1. The second pair of series-connected transistors includes PMOS transistor P2 coupled in series with NMOS transistor N2. However, one skilled in the art would understand how the transistor switchbox could be modified to include all NMOS, or all PMOS transistors, in alternative embodiments of the invention. Other transistor technologies, such as bipolar transistors, may be used in some embodiments. One skilled in the art would understand how the circuit implementations shown in FIGS. 2-3 could be modified in accordance with these alternative embodiments.

The gate terminals of transistors P1, N1, P2, and N2 are coupled for receiving differential input signals (IN, INB) from on-chip circuitry (e.g., transmit-side components 20, FIG. 1). In some cases, the differential input signals may be generated by a pre-driver (not shown) coupled between on-chip circuitry 20 and driver circuit 30. For example, a pre-driver may be included to separate the differential input signals (IN, INB) into primary (INP, NN) and inverse (INPB, INNB) phases. In some cases, transistors P1 and N1 may be coupled for receiving the primary phase (INP, INN), while transistors P2 and N2 are coupled for receiving the inverse phase (INPB, INNB) of the differential input signals. This ensures that transistors P2 and N1 will be turned OFF whenever transistors P1 and N2 are turned ON (and vice versa). However, a pre-driver may not be included in all embodiments of the invention. In some cases, the differential input signals (IN, INB) from the on-chip circuitry 20 may be supplied directly to the transistor switchbox. For example, the IN signal may be supplied to the gates of P2/N2, while the INB signal is supplied to the gates of P1/N1.

Differential output signals (OUT, OUTB) are generated at the interconnected drain terminals of the series-connected transistors in response to the input signals supplied to the gate terminals of transistor pairs P2/N1 and P1/N2. In some cases, a logic high output voltage (OUT) may be generated by activating transistor pair P1/N2 and deactivating transistor pair P2/N1. In other cases, a logic low output voltage (OUT) may be generated by deactivating transistor pair P1/N2 and activating transistor pair P2/N1.

The differential output voltages (OUT, OUTB) are conveyed to receiver 50 by directing the output current (Idrv) generated by driver portion 70 through an off-chip termination resistor (Rterm). Different output voltages are conveyed by activating a different one of the transistor pairs P2/N1 and P1/N2 to change the direction of the output current (Idrv) generated by the driver portion. In other words, the transistor pairs behave like bridges to direct the output current through the off-chip termination resistor (Rterm) in opposite directions to generate logic high and logic low output voltages at the inputs of the receiver. When the driver portion switches state, the direction of current flow across the termination resistor changes to generate an opposite logic state at the receiver inputs.

Most interface standards specify an optimal amount of driver output current (Idrv). In some cases, the driver output current may be adequately controlled by coupling appropriate current source and/or current sink devices to the transistor switchbox. The current embodiment shown in FIGS. 2-3 utilizes both a current source and a current sink. However, a skilled artisan would understand how driver portion 70 could be modified to include a substantially different number of current source and/or current sink devices.

The current source is implemented with PMOS transistors P3 and P4 in the embodiment of FIG. 2. The source terminals of transistors P3 and P4 are coupled to the power supply node (vcc), while the drain terminals of transistors P3 and P4 are coupled to the interconnected source terminals of the PMOS transistors (P1, P2) included within the switchbox. The current sink is implemented with cascade NMOS transistors N3 and N4. The drain terminal of transistor N3 is coupled to the interconnected source terminals of the NMOS transistors (N1, N2) included within the switchbox. The source terminal of transistor N4 is coupled to ground (vgnd).

Transistors P3, P4, N3, and N4 are current biasing devices. In the embodiment of FIG. 2, the gate terminals of transistors P3, N3 and N4 are coupled for receiving bias signals (vpbias, vnbiascas, vnbias). The bias signals supplied to transistors P3, N3 and N4 may be generated, for example, by an on-chip bias generation circuit (not shown). In some cases, the bias signals supplied to transistors P3, N3 and N4 may enable the driver portion to generate an optimal drive current. For example, the bias signals may enable the driver portion to generate a nominal 3.5 mA drive current (Idrv) when configured for driving LVDS signals. Transistor P4, however, receives its bias signal from feedback portion 80. This enables the drive current (Idrv) through the current source to be adjusted, so that a common mode voltage (vcm) of the differential output signals (OUT, OUTB) remains within an acceptable range. In one embodiment, the common mode voltage may be generated between two resistors (Rcm1, Rcm2), which are coupled in series between the output nodes 95 of the driver portion 70.

The feedback portion 80 shown in FIG. 2 includes a selection circuit 82 and a comparator 84. As noted above, selection circuit 82 may be coupled for receiving a first common mode voltage (vcm) from driver portion 70 and a second common mode voltage (vcm_alt) from replication portion 90. The first and second common mode voltages are received by the selection circuit at substantially the same time. In other words, the driver circuit generates two common mode voltages. This is altogether different from conventional driver circuits, which modify a common mode voltage to account for variations in process, voltage and temperature (PVT) or variations in circuit loads. The generation of two common mode voltages enables the present driver circuit to selectively use the first common mode voltage or the second common mode voltage, depending on an operating state of the driver portion.

In most cases, the selection circuit is configured for selecting the first common mode voltage when the driver portion is enabled and the second common mode voltage when the driver portion is disabled. The driver portion is said to be "enabled" whenever input signals are supplied to the transistor switchbox for directing driver output current across transmission path 40. The driver portion is said to be "disabled" when the input signals are supplied to turn off all four transistors in the transistor switchbox. As described in more detail below, selection of the common mode voltages may be controlled by output enable (oe, oe_n) signals supplied to the selection circuit.

Comparator 84 compares the common mode voltage selected by circuit 82 to a reference voltage (vref). In one embodiment, the reference voltage may be generated by a bandgap reference circuit configured for producing about 1.25 volts. However, a skilled artisan would understand how other reference generation circuits could be used for supplying a reference voltage to comparator 84. The other reference voltages may be similar to, or different than, the 1.25 volt reference mentioned above. However, a 1.25 volt reference may be preferred when the driver circuit is configured for driving LVDS signals.

Comparator 84 generates a feedback signal (vcmfb) based on the voltage difference detected between the reference voltage and the selected common mode voltage. As noted above, the feedback signal may be supplied back to one (or more) of the current biasing devices included within the driver portion for adjusting the amount of drive current (Idrv) generated therein through the current source. In some embodiments, the feedback signal may be supplied to the gate terminal of bias transistor P4, as shown in FIG. 2. However, the feedback signal may be additionally or alternatively supplied to another current biasing device (e.g., transistor N3 or N4) in other embodiments of the invention. The feedback signal is also supplied to replication portion 90 for generating the alternative common mode voltage (vcm_alt).

FIGS. 2, 3A and 3B illustrate one embodiment of a current replication portion 90 that may be used to provide an alternative common mode voltage. The current replication portion shown in FIGS. 2, 3A and 3B includes PMOS transistors P7, P8, NMOS transistors N11, N12 and resistors R1, R2. Transistors P7, P8, N11, N12 are identical to (or scaled versions of) the current biasing devices (P3, P4, N3, N4) used within driver portion 70. Resistors R1 and R2 are coupled in series between bias transistors P7/P8 and N11 for generating an alternative common mode voltage (vcm_alt). Unlike driver portion 70, current replication portion 90 is disconnected from the output pads 95 of the driver circuit. This enables the current replication portion to generate a common mode voltage, which is unaffected by off-chip circuit loads (e.g., loads within receive-side components 60).

In general, current replication portion 90 provides a current path, which mimics the external termination resistor and output driver when the output transistors (P1, P2, N1, N2) are inactive. In one example, the current path generates a copy (Ialt) of the driver current (Idrv) by replicating the current biasing devices (P3, P4, N3, N4) and bias signals (vpbias, vcmfb, vnbias, vnbiascas) used within the driver portion 70. Resistors R1 and R2 are selected to mimic the external termination resistor (Rterm). For example, the values of R1 and R2 may be selected, so that the resistor ratio of (R1+R2)/Rterm is substantially equal to the current ratio of (Idrv)/(Ialt). The alternative common mode voltage (vcm_alt) is generated between resistors R1 and R2. By replicating the devices and bias signals used within driver portion 70, current replication portion 90 is able to generate a common mode voltage, which would have been generated by driver portion 70, if the disabled driver portion were not affected by off-chip loads. Unlike the common mode voltage (vcm), however, the alternative common mode voltage (vcm_alt) is stable and isolated from the output pads of the driver circuit when the driver circuit is disabled.

In general, driver circuit 30 improves upon conventional driver circuit designs by adding a current replication portion 90 to the driver circuit and adding a selection circuit 82 to the common mode feedback portion 80. The current replication portion 90 functions as an "output keeping circuit" by providing an alternative common mode voltage (vcm_alt) to the feedback portion 80 when the driver portion 70 is disabled. This improves output enable timing by preventing the common mode voltage seen by the comparator from drifting when the output transistors (P1, P2, N1, N2) are inactive. The selection circuit 82 included within the feedback portion 80 allows the alternative common mode voltage (vcm_alt) to be used, in lieu of the common mode voltage (vcm), for generating the feedback signal when the driver portion is disabled. This enables the feedback portion 80 to provide a stable and predictable feedback signal (vcmfb) to the current biasing devices when the driver portion is disabled.

FIGS. 3A and 3B illustrate detailed embodiments of driver circuits (30A, 30B) with improved output enable timing in accordance with various embodiments of the invention. Like the general embodiment shown in FIG. 2, driver circuits 30A and 30B may be included within transmission system 10 for driving differential signals onto transmission path 40. Like the previous embodiment, driver circuits 30A and 30B each include a driver portion (70), a feedback portion (80A, 80B) and a current replication portion (90). In one embodiment, the driver portion shown in FIGS. 3A and 3B may be substantially identical to the driver portion shown in FIG. 2. The driver portion shown in FIGS. 3A and 3B may, therefore, be sensitive to off-chip loads whenever the circuit is disabled. Current replication portion 90 is included to prevent the common mode voltage from drifting. In one embodiment, the replication portion shown in FIGS. 3A and 3B may be substantially identical to the replication portion shown in FIG. 2. However, one skilled in the art would understand how the inventive concepts described herein may be applied to other driver configurations, which suffer from common mode voltage drift when the output transistors are inactive. This disclosure is intended to cover all such variations.

FIGS. 3A and 3B differ from one another by using substantially different feedback portions. For example, the feedback portion 80A shown in FIG. 3A includes a 2:1 multiplexer 82A coupled to the comparator 84A. The inputs of the multiplexer are coupled for receiving the common mode voltages (vcm, vcm_alt) from driver portion 70 and replication portion 90. The output of the multiplexer is coupled for supplying a select one of the common mode voltages to one input of the comparator, based on a control signal (oe) supplied to the multiplexer. In one embodiment, the control signal (oe) may be asserted when the driver portion 70 is enabled to select the common mode voltage (vcm), and deasserted when the driver portion 70 is disabled to select the alternative common mode voltage (vcm_alt). The opposite may be true in other embodiments of the invention.

The comparator 84A shown in FIG. 3A includes PMOS transistors P5, P6 and NMOS transistors N5, N6, N7. Transistors P5 and N5 are coupled in series between the power supply node (vcc) and drain terminal of bias transistor N7. Transistors P6 and N6 are also coupled in series between the power supply node (vcc) and drain terminal of bias transistor N7. Bias transistor N7 provides a current path to ground (vgnd) when enabled with a bias signal. In most cases, the bias signal supplied to the gate terminal of transistor N7 may be the same bias signal (vnbias) supplied to transistor N4 within driver portion 70. As such, the bias signal may be generated by an on-chip bias signal generator. However, other bias signals and/or means for generating bias signals may also be used.

In one embodiment, the gate terminal of transistor N5 may be coupled for receiving the select one of the common mode voltages (vcm or vcm_alt) from multiplexer 82A. In such an embodiment, the gate terminal of transistor N6 may be coupled for receiving the reference voltage (vref). The opposite may be true in other embodiments of the invention. In some cases, a bandgap reference circuit (not shown) may be coupled for supplying a reference voltage of about 1.25 volts to the gate terminal of transistor N6. The gate terminal of transistor P6 is coupled to the interconnected gate and drain terminals of transistor P5. In this configuration, transistors P5 and P6 form a current mirror for comparing the current flow through transistors N5 and N6. If the selected common mode voltage is greater than the reference voltage, more current will flow through N5, causing a higher feedback signal (vcmfb) level to be generated at the output node of the comparator (e.g., at the drain terminals of transistors P6/N6). If the selected common mode voltage is less than the reference voltage, more current will flow through N6, causing a lower feedback signal (vcmfb) level to be generated at the comparator output node.

The feedback portion 80A, therefore, consists of a multiplexer (82A) and a differential amplifier (P5, P6, N5, N6), which detects the difference between a reference voltage and a common mode voltage selected by the multiplexer. The multiplexer is coupled to one input of the differential amplifier for selecting between (or "multiplexing") the two common mode voltages generated within driver circuit 30A. The feedback signal (vcmfb) generated by the differential amplifier is fed back to at least one of the current biasing devices in driver portion 70 to adjust the output drive current through the current source for common mode control. The feedback signal (vcmfb) is also supplied to a corresponding one of the biasing devices included within current replication portion 90 to replicate the output drive current.

The driver circuit 30A shown in FIG. 3A improves output enable timing by providing a stable and predictable feedback signal (vcmfb) to the current biasing devices when the driver portion is disabled. However, driver circuit 30A may not be preferred in all embodiments of the invention. In some cases, the multiplexer used within feedback portion 80A may reduce the stability of the feedback loop by decreasing phase margin. A selection circuit with improved phase margin is provided in the embodiment shown in FIG. 3B.

Like the previous embodiment, feedback portion 80B includes a selection circuit for connecting a select one of the common mode voltages (vcm or vcm_alt) to a comparator. In one embodiment, the comparator shown in FIG. 3B may be similar to the comparator shown in FIG. 3A. For example, the comparator included within feedback portion 80B may include PMOS transistors P5, P6 and NMOS transistors N5, N6 and N7. Transistors P5, P6, N5, N6 and N7 may be coupled as described above in reference to feedback portion 80A. Unlike the previous embodiment, however, the actual common mode voltage (vcm) from driver portion 70 is supplied directly to the gate terminal of transistor N5. The alternative common mode voltage (vcm_alt) from current replication portion 90 is supplied directly to an additional NMOS transistor N8, which is coupled in parallel with the transistor N5.

A selection circuit is added to feedback portion 80B for multiplexing the actual (vcm) and alternative (vcm_alt) common mode voltages. The selection circuit shown in FIG. 3B includes an analog switch implemented with NMOS transistors N9 and N10. Transistor N9 is coupled in series between the drain terminals of transistors P5 and N5 and configured for receiving an output enable (oe) signal. Transistor N1 is coupled in series between the drain terminals of transistors P5 and N8 and configured for receiving a complementary output enable (oe_n) signal. In one example, the output enable signals (oe, oe_n) are provided by on-chip output control logic. The common mode voltages are multiplexed to feedback portion 80B by asserting the appropriate output enable signal. For example, the actual common mode voltage (vcm) may be selected by asserting the output enable (oe) signal and deasserting the complementary output enable (oe_n) signal. On the other hand, the alternative common mode voltage (vcm_alt) may be selected by asserting the complementary output enable (oe_n) signal and deasserting the output enable (oe) signal. The common mode voltage selected by the switch is used to generate the bias signal (vcmfb), which is fed back to driver portion 70 for controlling the current flow therein.

As noted above, the selection circuit shown in FIG. 3B provides an analog switch between transistor P5 and transistors N5 and N8. In some cases, the switch may provide better phase margin than the multiplexer used in FIG. 3A by adding less resistance and capacitance (which affects feedback loop stability) to the feedback portion. For this reason, driver circuit 30B may be preferred over driver circuit 30A, in at least one embodiment of the invention.

Figure 4:
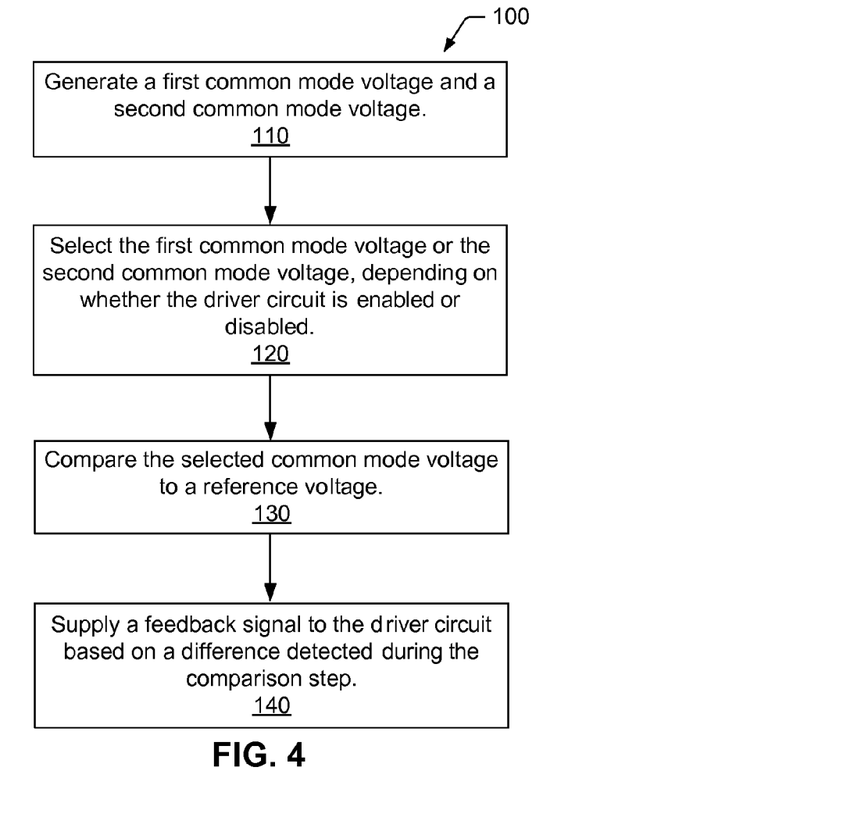
FIG. 4 is a flowchart diagram illustrating a method for operating the driver circuits shown in FIGS. 2, 3A and 3B.

FIG. 4 illustrates one embodiment of a method 100 for operating a driver circuit (30A, 30B) with improved output enable timing. In some cases, the method may begin by generating a first common mode voltage and a second common mode voltage (in step 110). The "first common mode voltage" may be the actual common mode voltage (vcm) generated by driver portion 70. The "second common mode voltage" may be the alternative common mode voltage (vcm_alt) generated by current replication portion 90. In some cases, the method may generate more than one "vcm_alt" signal (by including more than one current replication portion) and more than one "vref" signal. This would enable a single driver circuit to switch between the different common mode voltages needed for driving different I/O standards. Although multiple common mode voltages are generated, the method may use only one of the common mode voltages in a subsequent comparison step.

An appropriate common mode voltage is selected 120 based the output enable status of the driver circuit (i.e., whether the driver circuit is currently enabled or disabled). The actual common mode voltage (vcm) from driver portion 70 is selected (e.g., by setting oe=high and oe_n=low) when the driver circuit is enabled. On the other hand, the alternative common mode voltage (vcm_alt) from current replication portion 90 is selected (e.g., by setting oe_n=high and oe=low) when the driver circuit is disabled.

The selected common mode voltage is compared 130 to a reference voltage. In one example, the selected common mode voltage may be compared to a reference voltage of about 1.25 volts. Other reference voltages may be appropriate in other embodiments of the invention. The difference between the selected common mode voltage and the reference voltage is used to generate a bias signal (vcmfb), which is supplied 140 back to the driver portion for adjusting the current flow therein. When the driver circuit is enabled, the actual common mode voltage (vcm) is used to maintain the output common mode voltage around the reference voltage. When the driver circuit is disabled, the alternative common mode voltage (vcm_alt) is used to keep the bias signal (vcmfb) from drifting away from a desired value.

It will be appreciated to those skilled in the art having the benefit of this disclosure that this invention is believed to provide a driver circuit with improved output enable timing. The driver circuits and methods described herein improve output enable timing by keeping a stable and known bias level on the current biasing devices at all times, regardless of whether the driver circuit is enable or disabled. In one embodiment, the driver circuit embodiments described herein may provide an output enable time of about 106 ns. This is a vast improvement over conventional driver circuits, which suffer from significantly longer (e.g., greater than 200 ns) output enable times. The improved output enable timing enables the driver circuit to meet stringent timing specifications. The improved output enable timing also provides the advantages of faster driver recovery and lower system timing impact.

Further modifications and alternative embodiments of various aspects of the invention will be apparent to those skilled in the art in view of this description. For example, the driver circuit described herein is not limited to CMOS technology, and may be implemented with alternative technologies in other embodiments of the invention. Additional modifications or alternatives may include: 1) a different method of output common mode sensing could be used (e.g., resistors Rcm1 and Rcm2 can be replaced with transistors); 2) the feedback signal (vcmfb) could be supplied to an n-channel bias device, instead of the p-channel bias device shown herein; 3) a different feedback loop connection could be used (e.g., a gain stage can be added to the feedback amplifier after the first differential stage and the feedback signal can be taken after the gain stage); 4) the improved driver circuit could be used to drive a plurality of receivers connected in parallel; and 5) two or more different "vcm_alt" and "vref" signals could be generated/used to allow faster switching between different common mode output voltages (e.g. for driving different I/O standards from a single driver). Other modifications or alternatives not specifically mentioned herein may also be included without departing from the scope of the invention. It is intended, therefore, that the following claims be interpreted to embrace all such modifications and changes and, accordingly, the specification and drawings are to be regarded in an illustrative rather than a restrictive sense.

What is claimed is:

1. A method for operating a driver circuit, the method comprising:
   generating a first common mode voltage and a second common mode voltage;
   selecting the first common mode voltage or the second common mode voltage, depending on an operating state of the driver circuit, wherein said selecting comprises selecting the first common mode voltage when the driver circuit is enabled and selecting the second common mode voltage when the driver circuit is disabled;
   comparing the selected common mode voltage to a reference voltage; and
   supplying a feedback signal to the driver circuit based on a difference detected in the comparison step.

2. The method as recited in claim 1, wherein the step of generating comprises generating the first and second common mode voltages at substantially the same time.

3. The method as recited in claim 1, wherein the steps of generating, selecting, comparing and supplying enable a predictable feedback signal to be supplied to the driver circuit when the driver circuit is disabled.

4. A driver circuit, comprising:
   a feedback portion configured to receive a first common mode voltage from a driver portion and a second common mode voltage from a replication portion of the driver circuit, wherein the feedback portion comprises:
      a selection circuit configured to select: (i) the first common mode voltage when the driver portion is enabled, and (ii) the second common mode voltage when the driver portion is disabled; and
      a comparator configured to compare the selected common mode voltage to a reference voltage and to supply a feedback signal to the driver portion based on a difference detected there between.

5. The driver circuit as recited in claim 4, wherein the feedback portion receives the first and second common mode voltages at substantially the same time.

6. The driver circuit as recited in claim 4, wherein the driver portion comprises a transistor switchbox coupled in series between a first current source and a first current sink, and wherein the transistor switchbox comprises a first pair of series-connected transistors coupled in parallel with a second pair of series-connected transistors.

7. The driver circuit as recited in claim 6, wherein the first common mode voltage is generated between a first pair of resistive elements coupled in series between output nodes of the driver portion.

8. The driver circuit as recited in claim 7, wherein the driver portion is: (i) enabled when a first set of input signals are supplied to the transistor switchbox for turning on opposite transistors within the first and second pairs of series-connected transistors and directing driver output current through an off-chip resistive element coupled between the output nodes, and (ii) disabled when a second set of input signals are supplied to the transistor switchbox for turning off all transistors within the first and second pairs of series-connected transistors.

9. The driver circuit as recited in claim 8, wherein the replication portion comprises a second pair of resistive elements coupled in series between a second current source and a second current sink.

10. The driver circuit as recited in claim 9, wherein the second current source and second current sink are substantially identical to the first current source and first current sink, respectively, and wherein a combined resistance of the second pair of resistive elements is substantially identical to a resistance of the off-chip resistive element.

11. The driver circuit as recited in claim 9, wherein the second common mode voltage is generated between the second pair of resistive elements.

12. The driver circuit as recited in claim 4, wherein the comparator comprises:
   a first transistor configured to receive the selected common mode voltage;
   a second transistor configured to receive the reference voltage;
   a bias transistor coupled between ground and mutually-connected terminals of the first and second transistors; and
   a current mirror configured to generate the feedback signal by comparing a current generated through the first transistor to a current generated through the second transistor.

13. The driver circuit as recited in claim 12, wherein the selection circuit comprises a 2:1 multiplexer having two inputs configured to receive the first and second common mode voltages and one output configured to supply the selected common mode voltage to the first transistor based on a control signal supplied to the multiplexer.

14. The driver circuit as recited in claim 4, wherein the comparator comprises:
   a first transistor configured to receive the first common mode voltage;
   a second transistor configured to receive the reference voltage;
   a third transistor configured to receive the second common mode voltage;
   a bias transistor coupled between ground and mutually-connected terminals of the first, second and third transistors; and
   a current mirror configured to generate the feedback signal by comparing a current generated through the second transistor to a current generated through only one of the first and third transistors.

15. The driver circuit as recited in claim 14, wherein the selection circuit comprises a switch configured to connect the current mirror to either the first transistor or the third transistor, depending on a control signal supplied to the switch.

16. The driver circuit as recited in claim 15, wherein the switch comprises:

a fourth transistor coupled in series between the first transistor and a diode-connected transistor of the current mirror; and
a fifth transistor coupled in series between the third transistor and the diode-connected transistor.

17. A system, comprising:
   at least one system component configured for generating a pair of differential signals;
   a transmitter configured to modulate the differential signals before the modulated signals are driven across a transmission path to a receiver, wherein the transmitter comprises:
      a driver portion configured to modulate the differential signals and to generate a first common mode voltage of the modulated signals;
      a replication portion configured to generate a second common mode voltage;
      a selection portion configured to select the first common mode voltage or second common mode voltage; and
      a feedback portion configured to compare the selected common mode voltage to a reference voltage and to supply a feedback signal to the driver portion based on a difference detected there between.

18. The system as recited in claim 17, wherein the selection portion is configured for selecting the first common mode voltage when the driver portion is enabled and the second common mode voltage when the driver portion is disabled.

19. The system as recited in claim 17, further comprising a pair of output nodes configured to supply the modulated signals to the transmission path when the driver portion is enabled.

20. The system as recited in claim 19, wherein unlike the driver portion, the replication portion is disconnected from the output nodes, so that the second common mode voltage is unaffected by loads coupled to a receiving end of the transmission path when the driver portion is disabled.

21. The system as recited in claim 17, wherein the driver portion is configured for modulating the differential signals in accordance with an interface standard selected from a group comprising Low Voltage Differential Signaling (LVDS), Stub Series Terminated Logic (SSTL), differential High-Speed Transceiver Logic (HSTL) and Low Voltage Positive Referenced Emitter Coupled Logic (LFPECL).

* * * * *